United States Patent
Kieferndorf

(10) Patent No.: US 7,518,397 B2
(45) Date of Patent: Apr. 14, 2009

(54) CHIP WITH IN-CIRCUIT PROGRAMABILITY

(75) Inventor: Frederick Kieferndorf, Fiksbach (CH)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/968,294

(22) Filed: Jan. 2, 2008

(65) Prior Publication Data

US 2008/0157812 A1  Jul. 3, 2008

Related U.S. Application Data

(60) Provisional application No. 60/883,263, filed on Jan. 3, 2007.

(51) Int. Cl.
*H03K 19/173* (2006.01)
(52) U.S. Cl. .......................... 326/38; 326/40
(58) Field of Classification Search .............. 326/37–41
See application file for complete search history.

(56) References Cited

U.S. PATENT DOCUMENTS

| 5,412,260 A * | 5/1995 | Tsui et al. ..................... 326/39 |
| 7,397,274 B1 * | 7/2008 | Tang et al. .................... 326/40 |
| 2003/0033584 A1 * | 2/2003 | Zaveri et al. .................. 716/17 |

* cited by examiner

*Primary Examiner*—Don P Le
(74) *Attorney, Agent, or Firm*—Ostrolenk, Faber, Gerb & Soffen, LLP

(57) ABSTRACT

A circuit for enabling an IC having a normal mode for performing normal functions and a program mode for programming settings of the IC to use same pins in both modes. The circuit includes an input circuit for receiving the input data; internal circuits for processing the input data in the normal mode; a program circuit for processing the input data in the program mode, a program enable circuit for providing a program enable signal for switching the IC from the normal to the program mode; and a demultiplexer circuit for providing the input data as normal data to internal circuits when the IC is in the normal mode and as program data to the program circuit when the IC is in the program mode.

14 Claims, 4 Drawing Sheets

CHIP WITH IN-CIRCUIT PROGRAMABILITY

CROSS-REFERENCE TO RELATED APPLICATIONS

This application is based on and claims priority to U.S. Provisional Patent Application Ser. No. 60/883,263, filed on Jan. 3, 2007 and entitled CHIP WITH IN-CIRCUIT PROGRAMABILITY, the entire contents of which are hereby incorporated by reference.

BACKGROUND OF THE INVENTION

The present invention relates to programming settings of an IC chip and more particularly to programming settings of an IC chip from the pins of the IC chip, rather than at wafer level.

FIG. 1A shows an Intelligent Power Switch, having IN, $V_{DD}$, OUT and ST pins. In a normal mode, a signal at IN pin turns on a power switch $Q_1$, which, for example, can be a MOSFET. OUT pin connects first of two power terminals of the power switch $Q_1$ of the Intelligent Power Switch to a load and $V_{DD}$ pin connects the second power terminal of the power switch $Q_1$ to a power source. ST pin connects the circuitry of the Intelligent Power Switch to the ground. The internal circuits of the Intelligent Power Switch include a driver 2, connected to a control terminal of the switch $Q_1$ for controlling the switch, as well as other protective circuits for protecting the switch $Q_1$ in the event of short circuit, over-current, over-temperature, and other failures.

What is needed is an ability to program the Intelligent Power Switch without requiring dedicated programming pins, i.e., using existing pins of the Intelligent Power Switch IC.

SUMMARY OF THE INVENTION

It is an object of the present invention to provide an ability to program internal settings of an IC chip, e.g., an intelligent power switch (IPS), from the pins, rather than at wafer level.

It is a further object of the present invention to use the pins of the IC that are used for some other purpose, for programming values of the IC chip, such that no IC pins are dedicated for programming purposes.

A circuit is described for enabling an IC having a normal mode for performing normal functions and a program mode for programming settings of the IC to use same pins in both modes. The circuit includes an input circuit for receiving the input data; internal circuits for processing the input data in the normal mode; a program circuit for processing the input data in the program mode, a program enable circuit for providing a program enable signal for switching the IC from the normal to the program mode; and a demultiplexer circuit for providing the input data as normal data to internal circuits when the IC is in the normal mode and as program data to the program circuit when the IC is in the program mode.

Other features and advantages of the present invention will become apparent from the following description of the invention that refers to the accompanying drawings.

DETAILED DESCRIPTION OF EMBODIMENTS OF THE INVENTION

Figure 1A:
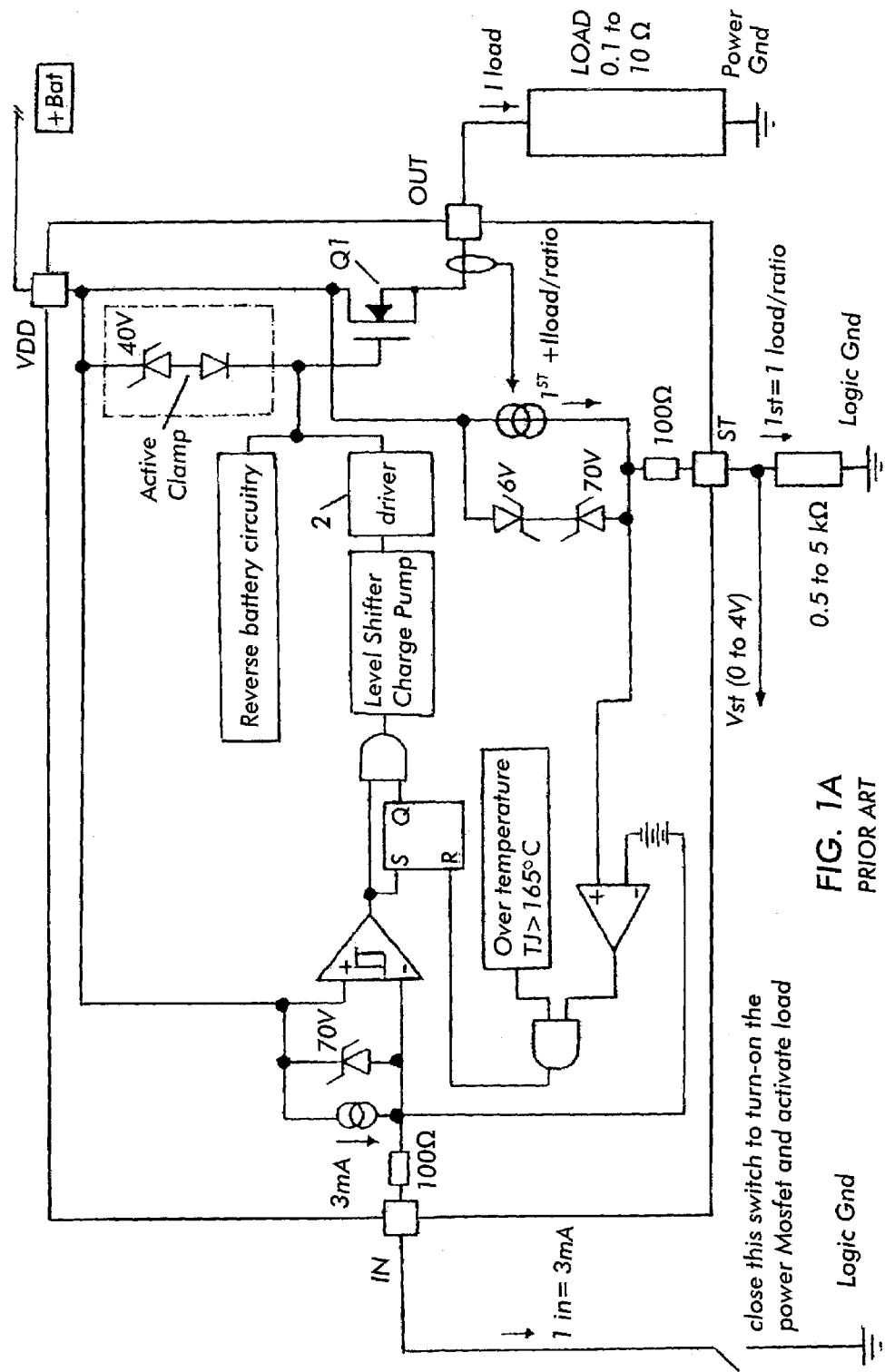
FIG. 1A is a block diagram of a common Intelligent Power Switch.
Figure 1B:
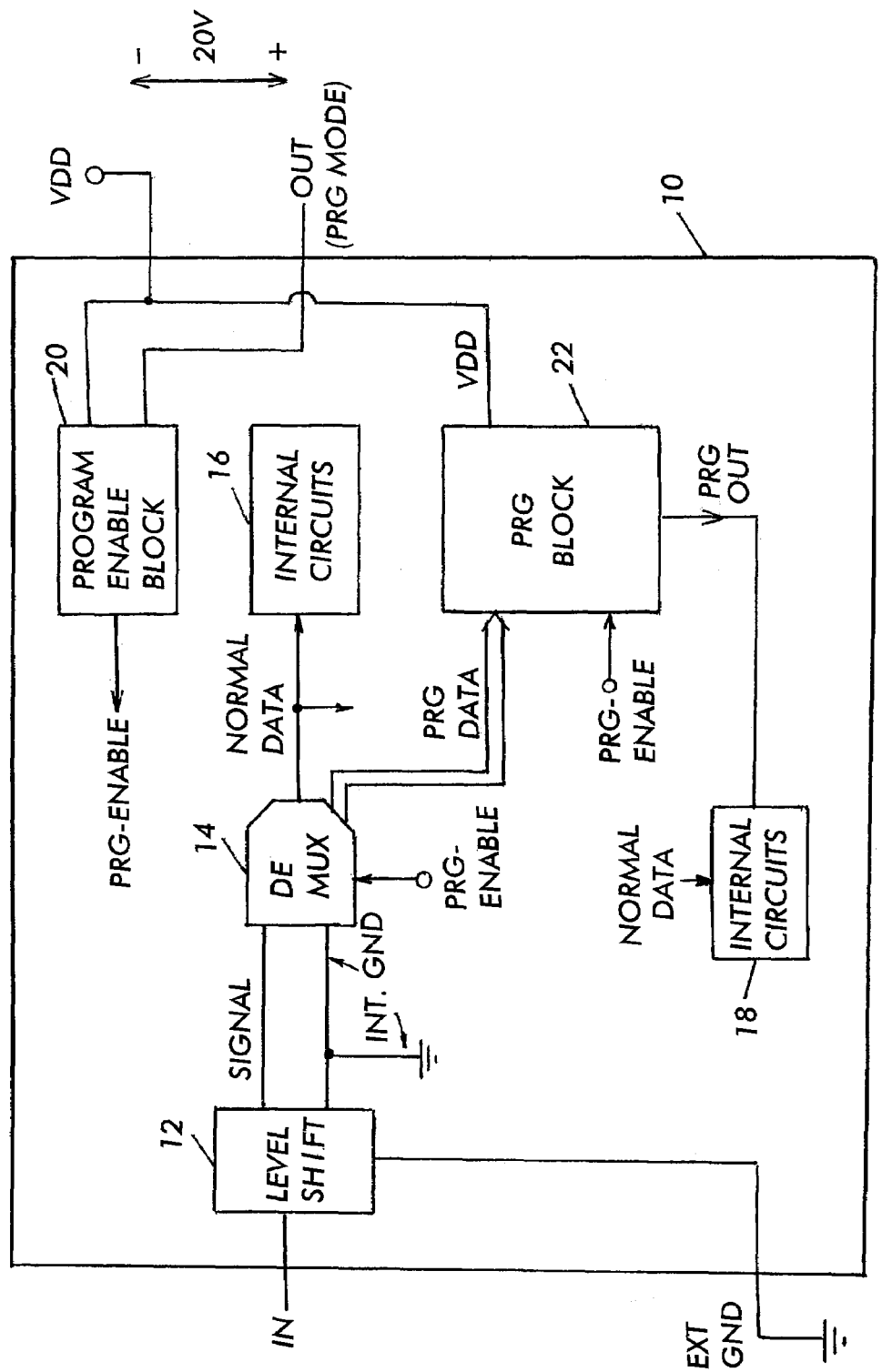
FIG. 1B is a block diagram of an integrated circuit of the present invention.

The invention illustrated in FIG. 1B provides an IPS IC 10 having additional circuits, which allow the pins described with reference to FIG. 1A to be used for an additional purpose, namely, to program values or settings into the IC's 10 internal circuits. Although an example of an IPS IC is used and only IN, GND, $V_{DD}$ and OUT pins are shown, the IC 10 can be any IC having additional external pins.

In addition to the described functions, the pins of the IC 10 are also used for programming of the IC 10. The IC 10 includes an input circuit 12, e.g., a level shift circuit, coupled to a demultiplexer circuit 14. The input circuit 12 receives serial input data from IN pin and forwards the received input data to the demultiplexer circuit 14 referenced to an internal ground. The demultiplexer circuit 14 demultiplexes the input signal into data and provides the data to internal circuits 16 and 18 of the IC 10 when the demultiplexer circuit 14 is in a normal mode, as set by the PRG_ENABLE signal, when it is low. The PRG_ENABLE signal being provided by a program enable circuit 20 that receives input signals from $V_{DD}$ and OUT pins. However, when the demultiplexer circuit 14 is caused to operate in a program mode when PRG_ENABLE signal goes high, it provides program data to a program circuit 22 of the IC 10. The program circuit 22, which is also connected to $V_{DD}$ pin, receives the program data and provides a program output signals to the internal circuits 18 that require re-programming.

The PRG_ENABLE signal of the program enable circuit 20 is used to switch the mode of the demultiplexer circuit 14 and the program circuit 22 between the normal and the program mode. The program enable circuit 20 initiates the program mode when it senses a mode change signal provided to assigned pins of the IC. In an example illustrated in FIG. 1B, mode change signal is a voltage difference of, for example 20V, between a voltage value on $V_{DD}$ pin and a voltage value on OUT pin illustratively connected to the program enable circuit 20 of the IC 10.

As in the IC of FIG. 1A, OUT, $V_{DD}$ and IN pins are also used for normal mode functions of the IC. For example, the OUT pin may be the source of the IPS power MOSFET switch.

Figure 2:
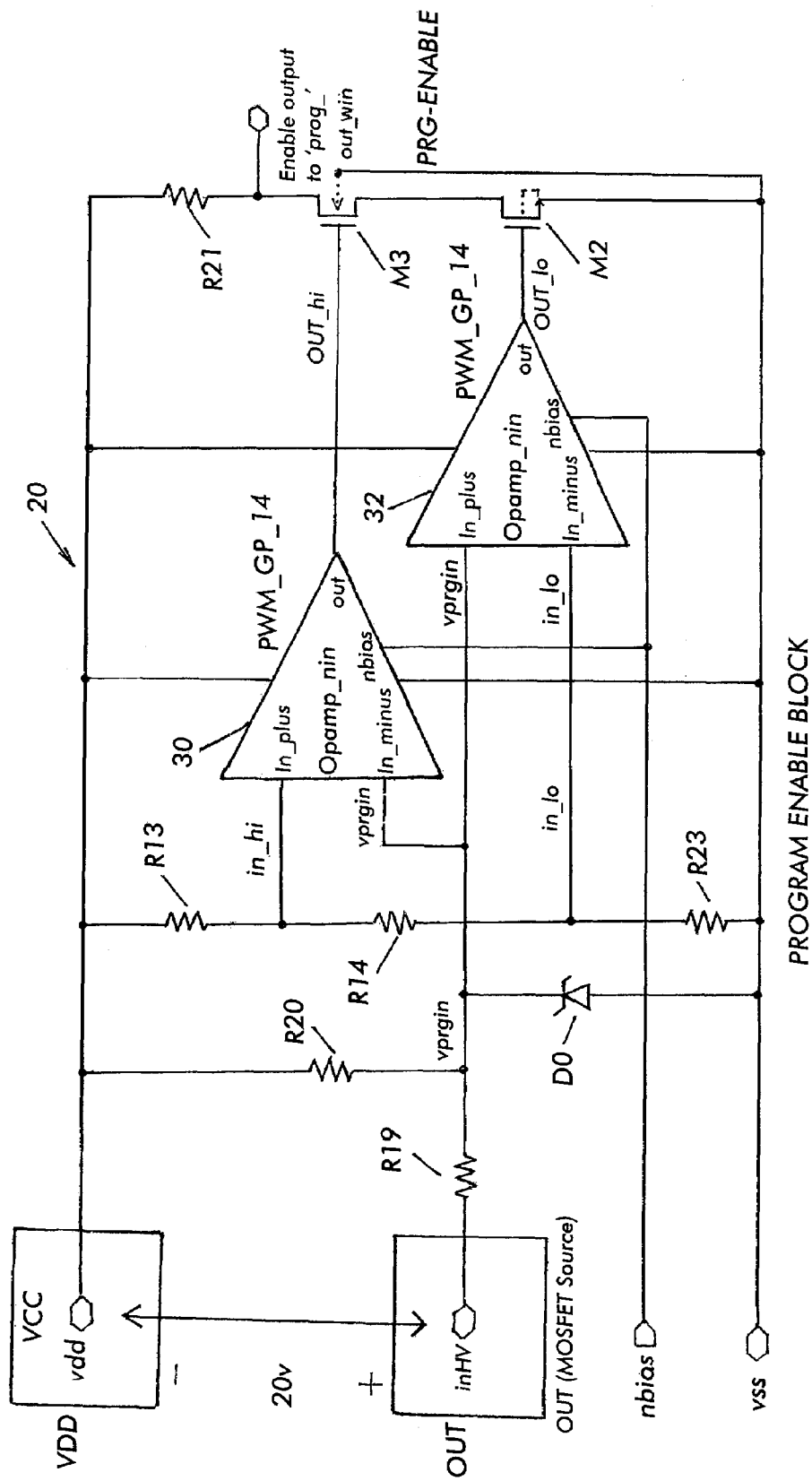
FIG. 2 is a block diagram of a program enable circuit used in the present invention.

The program enable 20, illustrated is FIG. 2, includes two operational amplifiers 30 and 32, whose outputs are respectively connected to control terminals of transistors M3 and M2. The transistors M3 and M2 being connected at one of their two power terminals. The second power terminal of the transistor M3 is coupled to, for example, a source having a first voltage potential $V_{DD}$. The second power terminal of the transistor M2 is coupled to, for example a source having a second voltage potential $V_{SS}$. A resistor R21 is coupled in series between the source having the first voltage potential $V_{DD}$ and the second power terminal of the transistor M3. The program enable signal is provided from a node between the second power terminal of the transistor M3 and the resistor R21.

The program enable 20 further includes series coupled resistors R13, R14, and R23 connected between the sources having the first and the second voltage potentials $V_{DD}$ and $V_{SS}$. Furthermore, a resistor 20 series coupled to the cathode of a Zener diode D0 is coupled to the source of the first voltage potential $V_{DD}$, while the anode of the Zener diode D0 is coupled to the source of the second voltage potential $V_{SS}$. A resistor R19 is coupled to a node between the resistor R20 and the cathode of the Zener diode D0 and to OUT pin of the IC 10.

The operational amplifier 30 receives its first (positive) input from a node between the resistors R13 and R14 and its second (negative) input, through resistor R19, from Out pin. The operational amplifier 32 has its first (positive) input connected through resistor R19, to Out pin, same as the second input of the operational amplifier 30. The operational amplifier 32 receives its second (negative) input from a node between the resistors R23 and R14. Additionally, the operational amplifiers 30 and 32 receive voltage from sources having the first and the second voltage potentials $V_{DD}$ and $V_{SS}$, and a bias voltage reference from an Nbias source of the IC 10.

Figure 3:
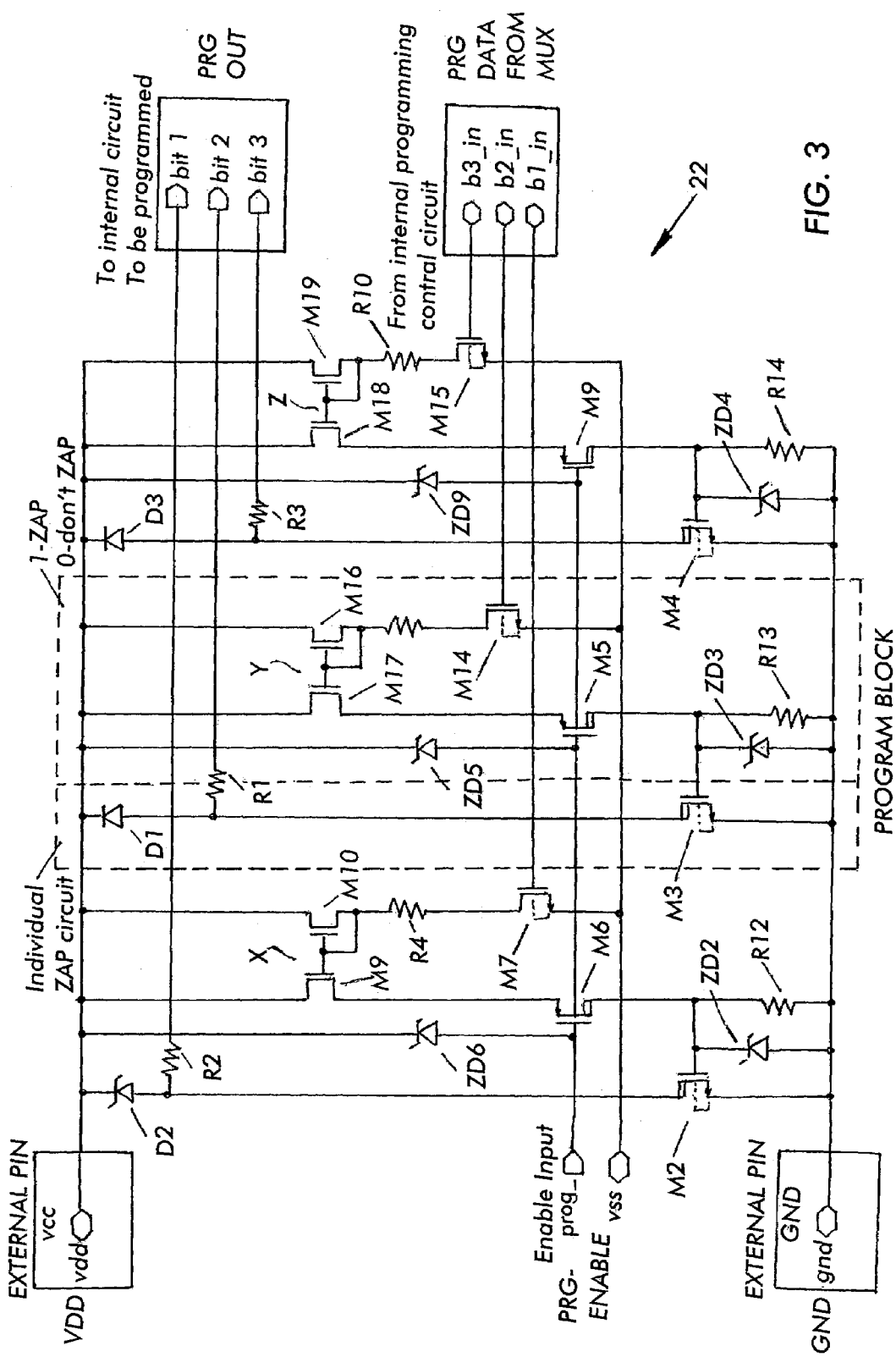
FIG. 3 is a block diagram of a program circuit used in the present invention.

Turning now to FIG. 3, the program 22 includes a plurality of zapping or setting circuits. Each zap circuit includes an anti-fuse diode, i.e., D2, D1, and D3, series connected via its anode to a respective transistor, i.e., M2, M3, M4, connected to external pin GND of the IC 10. The diodes are anti-fuse connections. When the respective transistor is turned ON, the connected diode is zapped or burned out, thereby shorting the diode. When the diode is zapped, the connection to pin VDD is shorted and the respective bit (bit 1, bit 2, bit 3) at PRG OUT is then closed or set high signal. Each bit 1, 2, and 3 being coupled to the anode of diodes D1, D2, and D3 via resistors R1, R2, and R3.

Each zap circuit is enabled by a respective transistor M6, M5, and M9. Each of the transistors M6, M5 and M9 having a Zener diode ZD6, ZD5, and ZD9 connected to the control terminal and the VDD pin. When the PRG_ENABLE signal goes high, these transistors (P channel) are turned OFF. Program data for each bit is received on the PRG DATA lines by respective transistors M7, M14 and M15. When program enabled, by the PRG_ENABLE signal, the demultiplexer circuit 14 provides the demultiplexed program data received at pin IN as the PRG DATA input to the program circuit 22 (FIG. 1B). When a bit on the PRG DATA input lines goes high, the respective transistor M7, M14, M15 is turned on. Each transistor M7, M14, M15 is coupled to a respective current mirror circuit X, Y, Z. When a PRG DATA bit goes high, the respective transistor M7, M14 or M15 is turned ON, sinking current from the connected current mirror circuit. The current mirror circuit sources current to the respective program enable transistor M6, M5, or M9, turning these transistors M6, M5 or M9 ON (PRG_ENABLE is high). This puts 6V voltage from Zener diodes ZD2, ZD3, and ZD4 on the gate of the respective transistor M2, M3, or M4, turning it on and blowing out the respective fusible diode D2, D1, or D3, setting the respective bit 1, bit 2, or bit 3 on PRG OUT. Each Zener diode ZD2, ZD3, and ZD4 being parallel connected with a respective resistor R12, R13, and R14.

The IC 10 enters the program mode when a voltage difference between OUT and $V_{DD}$ pins reaches a certain preset value, for example 20V. The program enable circuit 20 detects when the preset value is reached and sends the PRG_ENABLE signal indicating the mode switch from normal to program, to the demultiplexer circuit 14 and the program circuit 22. After receiving the PRG_ENABLE signal indicating the program mode, the demultiplexer circuit 14 sends the received program data to the program circuit 22 as the PRG DATA input.

Thus, if the program circuit 22 receives the program mode indicating signal PRG_ENABLE, it sets the bits via the fusible diodes, i.e., bit1, bit2, bit3, in accordance with the data received from the demultiplexer circuit 14, i.e., b1_in, b2_in, b3_in. It is assumed that the data supplied to the IC 10 when the voltage value between $V_{DD}$ and OUT pins reaches the preset value, is programming data.

Returning to FIG. 2, the program enable circuit 20 operates as follows: OUT pin is connected to common point of both op amplifiers 30 and 32 through Zener diode D0 that determines the activation voltage, i.e., 20V below $V_{DD}$. At this voltage, the outputs of both op amps 30 and 32 are high and switches M2 and M3 are then fully ON, thus PRG_ENABLE goes low or active.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A circuit for enabling an IC to have a normal mode for performing normal functions and a program mode for programming settings of the IC, the circuit comprising:
   a demultiplexer circuit for providing the input data as normal data when the IC is in the normal mode and as program data when the IC is in the program mode; and
   a program enable circuit for providing a program enable signal to switch the IC to the program mode.

2. The circuit of claim 1, further comprising
   an input circuit for receiving the input data;
   internal circuits for processing the input data as normal data; and
   a program circuit for processing the input data as program data,
   wherein, when the program enable signal is OFF the demultiplexer circuit provides the normal data to internal circuits and when the program enable signal is ON the demultiplexer circuit provides the program data to the program circuit.

3. The circuit of claim 1, wherein the program enable circuit is connected to first and second pins of the IC and provides the program enable signal when a voltage difference between the first and second pins reaches a preset value, the program enable signal indicating the IC switching from the normal to the program mode.

4. The circuit of claim 3, wherein the program enable circuit further comprises at least one operational amplifier, each operational amplifier controlling a switch.

5. The circuit of claim 3, wherein when the IC is in the program mode the program circuit sets signal bits addressed by the program data.

6. The IC of claim 5, wherein the program circuit comprises a plurality of zap circuits each having a fusible diode and a transistor switch.

7. The IC of claim 6, wherein each zap circuit is controlled by an enabling circuit that allows the zap circuit to blow the fusible diode when data is received from the demultiplexer circuit.

8. The IC of claim 1, wherein the IC is an Intelligent Power Switch.

9. The IC of claim 2, wherein the input circuit is a level shift circuit.

10. A circuit for enabling an IC having a normal mode for performing normal functions and a program mode for programming settings of the IC to use same pins in both modes, the circuit comprising:
    an input circuit for receiving the input data;
    internal circuits for processing the input data in the normal mode;
    a program circuit for processing the input data in the program mode,
    a program enable circuit for providing a program enable signal for switching the IC from the normal to the program mode; and a demultiplexer circuit for providing the input data as normal data to internal circuits when the IC is in the normal mode and as program data to the program circuit when the IC is in the program mode.

11. The circuit of claim 10, wherein the program enable circuit is connected to first and second pins of the IC and provides the program enable signal when a voltage difference between the first and second pins reaches a preset value.

12. The circuit of claim 11, wherein, when the program enable signal is OFF the IC operates in the normal mode and when the program enable signal is ON the IC switches from the normal to the program mode.

13. A circuit for enabling programming of settings in an IC from pins of the IC, the circuit comprising:

an input circuit receiving input data from an external pin of the IC;

a demultiplexer circuit coupled to the input circuit for receiving the input data and forwarding the input data to internal circuits for normal mode IC operation and forwarding the input data to a program circuit for program mode IC operation;

a program enable circuit for providing a program enable signal for switching the IC between a normal mode and a program mode; and wherein in the program mode the program circuit sets bits addressed by the input data provided by the demultiplexer.

14. The circuit of claim 13, wherein the program enable circuit provides a program enable signal when a voltage difference between two predetermined pins of the IC reaches a preset value.

* * * * *